United States Patent [19]

Grube, Jr.

[11] 4,313,025
[45] Jan. 26, 1982

[54] UNITARY DIE-CAST ASSEMBLY FOR ELECTRONIC CIRCUITS

[75] Inventor: Franklin F. Grube, Jr., West Chicago, Ill.

[73] Assignee: Motorola, Inc., Schaumburg, Ill.

[21] Appl. No.: 156,296

[22] Filed: Jun. 4, 1980

[51] Int. Cl.³ ............................................. H05K 5/04
[52] U.S. Cl. .................................. 174/50; 165/135;
188/1 B; 220/22; 220/305
[58] Field of Search ............... 220/305, 22; 174/35 R,
174/35 MS, 50, 52 R; 361/424; 165/135; 188/1 B

[56] References Cited

U.S. PATENT DOCUMENTS

| | | |
|---|---|---|
| 266,677 | 10/1882 | Corbett . |
| 296,146 | 4/1884 | Davis . |
| 1,595,356 | 8/1926 | Moseman ........................ 220/22 X |
| 2,604,507 | 7/1952 | Tyson ........................ 174/35 GC |
| 3,139,559 | 6/1964 | Heidler . |
| 3,459,875 | 8/1969 | Fork . |
| 3,617,610 | 11/1971 | Katayama . |
| 3,909,679 | 9/1975 | Petri . |
| 3,956,673 | 5/1976 | Seid . |
| 4,000,447 | 12/1976 | Codrino . |
| 4,047,242 | 9/1977 | Jakob . |
| 4,066,837 | 1/1978 | Miura ........................ 174/35 MS X |
| 4,091,232 | 5/1978 | Lenk ........................ 174/52 R |

*Primary Examiner*—B. A. Reynolds
*Assistant Examiner*—D. A. Tone
*Attorney, Agent, or Firm*—Sang Ki Lee; Edward M. Roney; James W. Gillman

[57] ABSTRACT

A unitary die-cast for housing electronic circuits includes one or more compartments or cavities adapted to receive a circuit boards therein. A compartment with a cavity includes a post centrally located in the bottom and extending upwardly in the middle of the cavity. A fastening device, such as a screw, is used to forcibly affix a rigid but flexible cover onto the housing at the center post. The cast and the cover are made of electrically conductive but acoustically dampening material. When the cover is forcibly affixed to cover the cavity, the cover and the chassis provide an acoustically and microphonically dampened housing for the circuit placed therein. The cast includes a wall separating the compartments, and the wall has a cavity along the length thereof and substantially co-extensive therewith for providing a thermal separation between the compartments whereby the wall acts as a thermal insulator.

1 Claim, 3 Drawing Figures

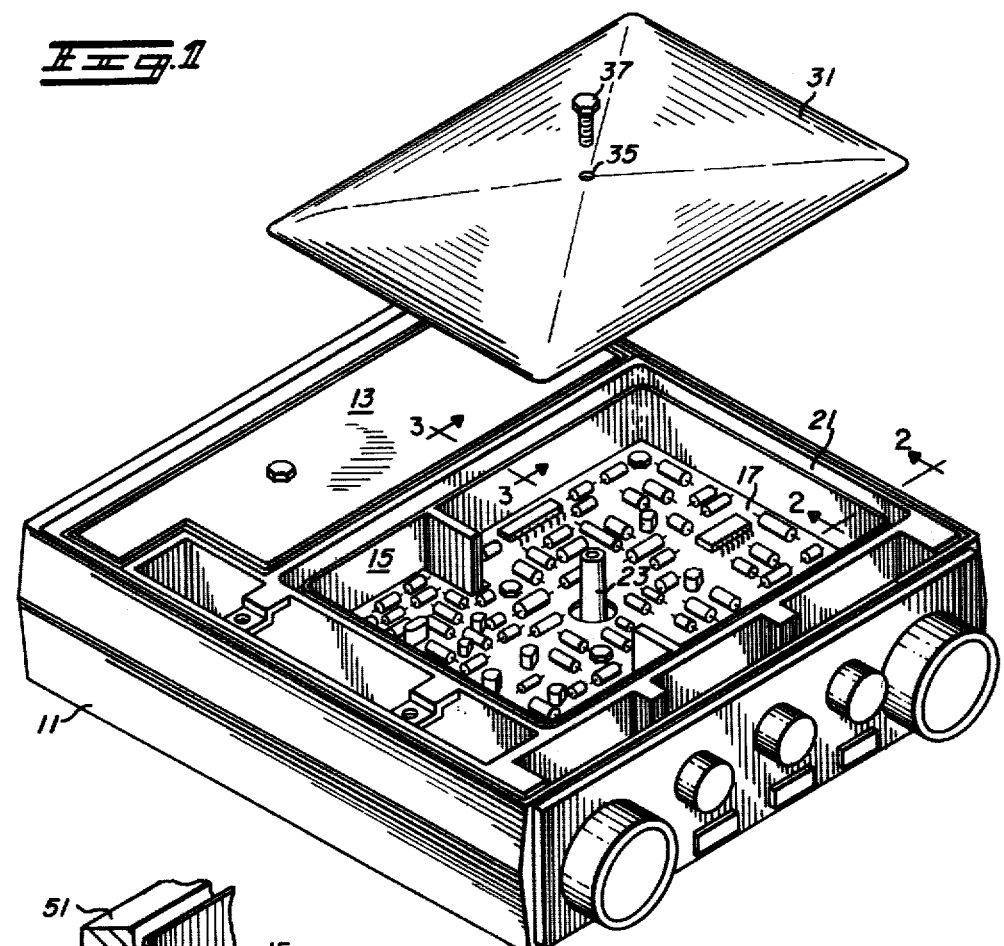
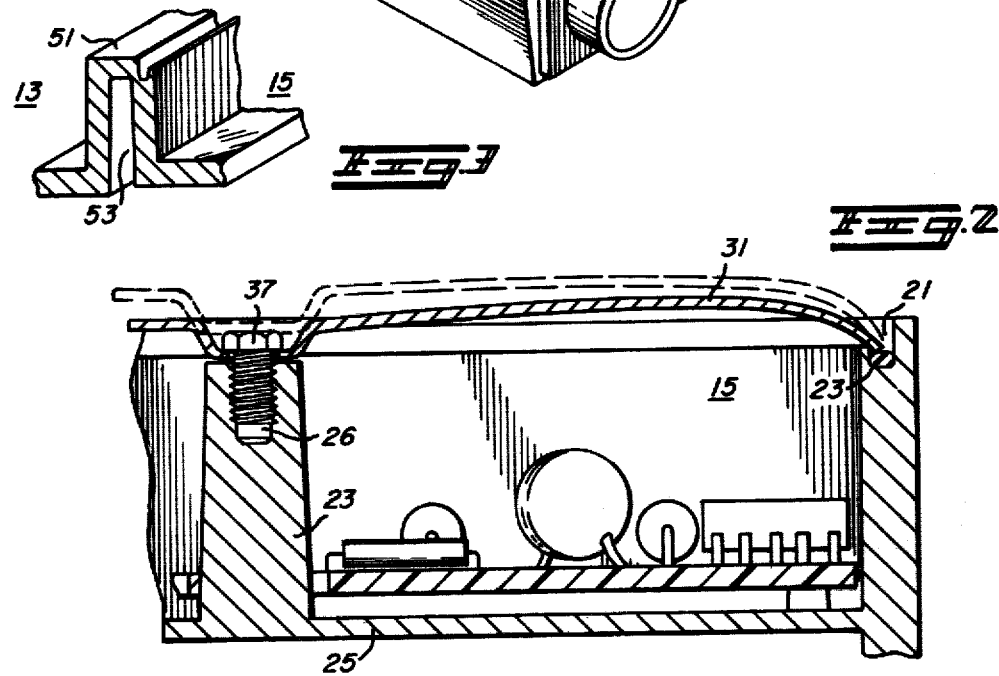

UNITARY DIE-CAST ASSEMBLY FOR ELECTRONIC CIRCUITS

BACKGROUND OF THE INVENTION

The present invention pertains to a housing for electronic circuits and, more particularly, to an improved housing with a unitary die-cast for electronic circuitry designed to operate at very high frequencies.

There has been a long-felt need for a unitary die-cast with a minimum number of parts to house various operative functional parts of electronic circuitry, such as two-way radios with desirable electrical, acoustical and microphonic characteristics. Substantial research and development efforts have been made in recent years to design a single unitary die-cast with separate compartments for housing microphonically sensitive circuits, power supply or transmitter which generates considerable heat, and other functional parts, all to be contained in a single unitary die-cast assembly.

Significant advances have been made in recent years in the design of such a unitary die-cast housing assembly, as shown, for example, in the U.S. Pat. No. 4,091,232 to Gerd Garry Lenk and Robert Allen Paul, and assigned to Motorola, Inc., the assignee of the present invention. The patent shows a die-cast housing assembly, especially adapted to provide a low microphonic enclosure for certain type of circuits such as ceramic-based circuits which are very sensitive to acoustic vibrations. Microphonics refer to variations in the electrical performance of a circuit, such as, a change in the frequency of oscillation of an oscillator circuit, as a result of mechanical stress or vibrations imparted to the sensitive components in the electrical circuit. This problem is especially acute at very high frequencies since any motion of a component in an RF field may frequency or phase modulate the RF circuit, thereby inducing spurious modulation. The patent shows a low microphonic assembly that includes a housing with a cavity for receiving and supporting an electrical circuit board therein. A rigid cover is forcibly affixed to enclose the housing cavity by a plurality of fastening elements, such as screws, tightening the cover at the periphery thereof to the periphery of the housing.

While the aforementioned type of low microphonic circuit is found satisfactory, nevertheless, it has been found that the steps involved in fastening a plurality of screws is time-consuming, and, also, it is found that the amount of force applied to the screws for fastening them against the cover is not easily controllable. This resulted in relatively un-uniform pressure being exerted by the screws against the cover on the rim of the housing cavity. This tended to cause a relative decrease in the acoustic and microphonic dampening of the cavity.

According to yet another aspect of the prior art, difficulties are encountered in insulating a heat sensitive component or functional unit of radio circuits or electronic circuits from others which are more sensitive to heat. Usually thermal stabilizing circuits, heat sinking or dissipating members are used to dissipate the heat generated by certain parts of the electronic circuit, such as power supplies or transmitting circuitry.

SUMMARY OF THE INVENTION

In accordance with the present invention, the aforementioned shortcomings and problems are overcome by providing a unitary die-cast for the housing assembly which provides a microphonically and acoustically dampened cavity with a cover and a single fastening element.

Still another feature of the present invention is to provide a channel cavity in the wall partitioning the compartments of the unitary die-cast to provide thermal insulation from one cavity to another cavity.

The foregoing and other objects and features of the present invention will become clearer from the detailed description of an illustrative embodiment of the present invention with reference to the accompanying drawings.

BRIEF DESCRIPTION OF THE DRAWINGS

FIG. 1 shows a planar perspective view of an RF radio chassis with a circuit board disposed therein that embodies the present invention.

FIG. 2 shows a side view of a cavity and partitioning wall, and the cover for the cavity along 2—2 shown in FIG. 1 illustrative of the present invention.

FIG. 3 shows a cut side view of a partitioning wall of the chassis along 3—3 in FIG. 1 with a channel cavity as a thermal choke.

DETAILED DESCRIPTION OF THE INVENTION

Referring to FIGS. 1 and 2, the preferred construction of the housing for an electronic circuit includes a unitary die-cast member (11) which may include a plurality of compartments (13, 15) for receiving a circuit board respectively. Each of the circuit boards may be a functional unit such as a frequency synthesizer (17) or power supply circuit. A frequency synthesizer may comprise a plurality of electrical components fabricated on a ceramic substrate or some other material composition designed to provide a very high frequency oscillation source of many different frequencies. An example of such a circuit board is a frequency synthesizer that provides frequency oscillations of particular frequencies in very high frequency range. At the very high frequency, any variations in the RF field and acoustic vibrations around the electrical components on the circuit board can cause a significant variation in oscillation tuning, and thus the circuit is sensitive to microphonics. The objective, of course, of the microphonic housing is to minimize or eliminate, if at all possible, any variations in the RF field.

The die-cast member (11) is a single casting and an acoustically dampening, but electrically conducting, material. The casting is made of aluminum or zinc, or any other suitable material, and the casting is designed to provide a housing (11) adapted to receive an amplifier power supply circuit which constitutes functional units of an electronic apparatus such as a two-way radio which includes a circuit, such as a synthesizer that is especially sensitive to microphonics. As illustrated in FIGS. 1 and 2, the die-cast member (11) includes a cavity or compartment (15) formed by a partitioning wall surrounding all sides of the cavity.

Along the open end or the top end of the wall, there is provided a ridge with a recessed channel (21). The channel (21) situated completely around the ridge of the cavity as illustrated in FIG. 1. The recessed channel is dimensioned to receive a gasket (23) of a suitable composition. The gasket may be composed of a somewhat resilient material that fits into the recess along the rim of the housing. As illustrated in FIG. 2, there is provided a post (23) extending upwardly substantially from the center of the base (25) of the housing. The post (23) is an integral part of the die-cast. The post (23) is center-tapped to provide a hole (26) so that a threaded screw (37) may be fastened into the post (23). There is provided a cover (31) which is somewhat concave downwardly and dimensioned to fit over the housing such that the rim of the cover fits over the gasket (23) along the ridge of the wall making up the compartment or cavity (15).

The cover (31) is preferably made of an acoustically dampening, but electrically conducting material and is of a type that is rigid but flexible or stated in other words, is of a material that maintains a high flexural modulus such as Matensite M-3100 marketed by Inland Steel Corporation. The cover has a center tap (35) to receive the threaded screw (37). Acoustically and microphonically dampened cavity is provided by placing the cover (31) as mentioned above and tightening the screw (37) against the cover so that the cover tightly seals the cavity (15). The force exerted and maintained by the tightened screw (37) is such that the somewhat flexible cover is bent into the cavity. Thus, as illustrated in FIG. 2, the cover is depressed at the center thereof from the normal position shown in the dotted line. The pressure applied by screw (37) is transferred to the peripheral edge or rim of the cover, and pressure is radially and downwardly applied at the rim of the cover against gasket (23). In this manner, the base (25), the side walls and the cover (31) form acoustically and microphonically dampened cavity for the circuit to be placed therein. The conductive cover and the conductive chassis enclose and thus provide electromagnetic shield for the electronic circuit board within the housing from the external electromagnetic fields.

According to yet another feature of the present invention, the partitioning wall itself is utilized as also a thermal insulator so that the heat generated in one compartment is not allowed to get to another compartment. As illustrated in FIG. 3, there is shown a wall (51) which partitions one cavity or compartment (15) from another (13) and which is part of the unitary die-cast member (11). Where it is necessary to prevent a heat generated in one compartment (13) from transferring or being conducted into another adjacent compartment (15), a recessed channel or cavity (53) is provided in the partitioning wall along the length of the wall. The channel 53 is substantially co-extensive with the wall. The thickness of the wall (51) on both sides of the channel (53) and the width of the cavity or channel (53) are dimensioned so that maximum thermal insulation is provided by the cavity in the wall between adjacent compartments.

In many electronic circuitries, such a thermal insulation is highly desirable if one functional part of the circuit is heat sensitive and another functional part of the electronic circuitry generates heat and yet they have to be packed in a compact space. For example, in a typical RF radio transceiver, the power transmitting unit tends to generate a substantial amount of heat, whereas synthesizers or oscillators or certain other parts are sensitive to ambient temperature variations. In such a case, the circuit sensitive to thermal variation is placed in one compartment or cavity and the power transmitting unit is placed in another compartment separated by heat-insulating partitioning wall (51).

It is found that in operating a typical two-way RF radio, the transmitter is not powered all the time, but is put into use intermittently. So the power is applied to the transmitter to transmit signals when required and then turned off when signals are not transmitted. Thus, in between the actual use, the power is not applied, and thus heat is not generated. So, the heat generated during the intermittent usage is dissipated through the surface of the chassis or heat sink provided therefor during the time intervals when the radio is not in use. If the two-way radios were continuously used, even the partitioning wall with a cavity that provides the insulation may not be adequate in that, eventually, heat would transfer from the compartment where the heat is generated to the compartment where heat is not desired through the wall. But because of the intermittent use and the cooling provided during the time intervals when the radio is not in use, the partitioning wall with cavity is found sufficient to provide thermal insulation during the short time intervals when the electronic circuit or the radio is in actual use and when the heat is generated. When the radio is no longer used, the heat dissipates through the walls and the heat sinks or through the chassis. Thus, heat never reaches high enough to interfere with the operation of the circuit elements or units placed in the cavity adjacent to the cavity where heat generating unit is placed.

Hereinabove, the present invention is described in detail. In summary, according to the present invention, a solitary conductive die-cast member with a cavity and cover and a single fastening means are used to form an acoustically and electrophonically dampened cavity. The present invention also includes a thermally insulating partitioning wall with a cavity forming an integral part of the die-cast for providing thermal insulation of one compartment from another adjacent compartment. Various modifications and changes may be made to the unitary die-cast assembly without departing from the spirit and scope of the present invention.

I claim:

1. An assembly housing for electronic circuits, the assembly comprising a unitary die-cast, said unitary die-cast having at least a pair of compartments, each for receiving a circuit board, the two compartments being partitioned by a wall, said wall having a channeled cavity for providing a thermal separation between the two compartments whereby said wall acts as a thermal insulator, at least one of said compartments forming a housing with a cavity for receiving a circuit board therein, said housing being made of a rigid and a highly acoustically dampening material, a cover adapted to cover said housing and enclose the cavity, said cover being a rigid but flexible material, and means for forcibly fastening the cover to the housing through an aperture situated substantially at the center thereof, said fastening means comprising a center tap post positioned substantially in the center of the cavity, said post being an integral part of the die-cast, and a threaded screw adapted to fasten said cover forcibly onto the housing through a tap in the center of the cover so that the force applied to the cover by the tightened screw applies pressure onto the cover whereby the pressure applied to the cover causes the cover to apply lateral and downward pressure to provide microphonically enclosed and dampened housing for said circuit board.

* * * * *